United States Patent

[11] 3,615,455

[72] Inventors Urbain Leopold Laridon
Wilrijk;
Gerard Albert Delzenne, S-Gravenwezel,
both of Belgium

[21] Appl. No. 779,625
[22] Filed Nov. 27, 1968
[45] Patented Oct. 26, 1971
[73] Assignee Gevaert-Agfa N. V.
Mortsel, Belgium
[32] Priority Jan. 12, 1968
[33] Great Britain
[31] 1952/68

[54] PHOTOPOLYMERIZATION OF ETHYLENICALLY UNSATURATED ORGANIC COMPOUNDS
8 Claims, No Drawings

[52] U.S. Cl. .................................................. 96/35.1,
96/115 P, 204/159.23, 204/159.24
[51] Int. Cl. .................................................. C08f 1/20
[50] Field of Search ............................................. 96/35.1,
115 P; 204/159.23, 159.24

[56] References Cited
UNITED STATES PATENTS
3,279,919 10/1966 Laridon et al. ............... 96/35.1
3,374,160 3/1968 Mao ............................. 204/159.23

*Primary Examiner*—William D. Martin
*Assistant Examiner*—J. E. Miller, Jr.
*Attorney*—Alfred W. Breiner

ABSTRACT: The photopolymerization of ethylenically unsaturated organic compounds in the presence of a diacylhalomenthane photopolymerization initiator having the structural formulas:

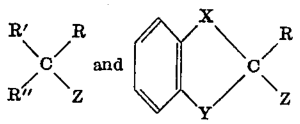

wherein:

Z represents chlorine or bromine,

R represents hydrogen, chlorine, bromine or acetyloxy,

R′ and R″ represent benzoyl, nitrobenzoyl, dimethylaminobenzoyl, phenylsulfonyl, carboxyphenylsulfonyl, methylphenylsulfonyl, or naphthoyl, X and Y represent carbonyl or sulfonyl is described. Exposure times for the polymerization is substantially reduced permitting use of low-intensity radiation.

PHOTOPOLYMERIZATION OF ETHYLENICALLY UNSATURATED ORGANIC COMPOUNDS

The present invention relates to the photopolymerization of ethylenically unsaturated organic compounds and to polymers obtained therefrom.

The photopolymerization of ethylenically unsaturated organic compounds can be initiated by exposure to high intensity radiation such as ultraviolet radiation. For instance, when exposing methyl acrylate, for a long time to sunlight, it is transformed into a transparent mass (cf. Ellis: The Chemistry of Synthetic Resins, Vol. II (1935) page 1072). However, polymerization by the use of mere light, proceeds at a much slower rate as compared with polymerization brought about by a free radical-generating catalyst or by heat. Moreover, the use of light alone, unaided by other agents, required very long exposure times in order to polymerize the monomer sufficiently. Furthermore, the low rate of polymerization necessitates the use of extremely intense radiations, such as those obtained from high intensity carbon arcs.

A great many of photopolymerization initiators, which under the influence of actinic light increase the photopolymerization rate, have already been described. A survey of such photopolymerization initiators has been given by G. Delzenne in Industrie Cimique Belge, 24 (1959) 739–764.

According to the present invention a process is provided for the photopolymerization of ethylenically unsaturated organic compounds, which process comprises irradiating with light of wavelengths ranging from 2,500 to 5,000 Angstroms a composition comprising a photopolymerizable ethylenically unsaturated organic compound and as a photopolymerization initiator a diacylhalomethane corresponding to one of the following general Formulas:

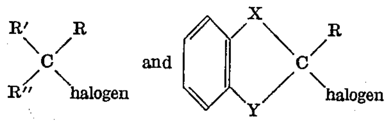

wherein:

halogen represents a halogen atom such as chlorine and bromine,

R represents a hydrogen atom, a chlorine or a bromine atom, or an acetyloxy group, R′ and R″ (same or different) represents a benzoyl group, a nitro-benzoyl group, a dimethylamino benzoyl group, a phenyl-sulphonyl group, a carboxyphenylsulphonyl group, a methyl-phenyl-sulphonyl group, or a naphthoyl group, X and Y (same or different) represent a carbonyl group or a sulphonyl group.

These diacylhalomethanes are obtained by halogenation of the corresponding diacylmethanes in chloroform or in acetic acid.

Particularly valuable diacylhalomethanes are:

2-bromo-1,3-diphenyl-1,3-propanedione
2,2-dibromo-1,3-diphenyl-1,3-propanedione
2-bromo-2-hydroxy-1,3-diphenyl-1,3-propanedione, acetate
2-bromo-2-(phenylsulphonyl)-acetophenone
2,2-dibromo-2-(phenylsulphonyl)-acetophenone
2-bromo-2-(p-tolylsulphonyl)-acetophenone
2-bromo-2-(phenylsulphonyl)-4′-nitro-acetophenone
2-bromo-2-(phenylsulphonyl)-4′-dimethylamino-acetophenone
2bromo-2-(m-carboxyphenylsulphonyl)-acetophenone
2-bromo-2-(phenylsulphonyl)-1′-acetonaphthone
2,2-dichloro-2-(p-tolylsulphonyl)-acetophenone
dibromo-bis(phenylsulphonyl)-methane
2,2-dibromo-1,3-indanedione
2,2-dibromo-benzo[b]thiophene-3(2H)one-1,1-dioxide The quantity of diacylhalomethane to be used as photopolymerization initiator is of course dependent upon many variables including the particular diacylhalomethane used, the wavelength of light employed, the irradiation time, and the monomer or monomers present. Usually the amount of diacylhalomethane is between 0.01 and 5 percent by weight calculated on the monomeric material initially present. It is seldom necessary to employ more than 0.2 to 2 percent by weight to obtain a good polymerization rate.

The ethylenically unsaturated organic compounds may be exposed to any source of radiation providing wavelengths in the range of 2,500–5,000 Angstroms, preferably in the wavelength region of 3,000–4,000 Angstroms. Suitable light sources include carbon arcs, mercury vapor lamps, fluorescent lamps, argon glow lamps, photographic flood lamps, and tungsten lamps. Moreover, ordinary daylight may also be used.

The photopolymerization can be carried out according to any of the well-known processes, such as bulk-, emulsion-, suspension-, and solution-polymerization processes. In all these processes, the addition of a diacylhalomethane according to the invention to polymerizable materials subjected to the action of actinic light greatly increases the rate of photopolymerization.

A base or support may be coated with a solution of the ethylenically unsaturated organic compound in a solvent therefore, this solution containing in dissolved state or homogeneously dispersed therein a photopolymerization-initiating diacylhalomethane, whereupon the solvent or solvent mixture is eliminated by known means such as evaporation, leaving a more or less thin coating of the ethylenically unsaturated organic compound on the base or support. Thereafter the dried photopolymerizable coating is exposed to actinic light rays.

When exposing the photopolymerizable composition to actinic light rays the polymerization does not start immediately. Only after a short period, which among others depends on the ethylenically unsaturated organic composition, the photopolymerization initiator, and the light intensity used, the photopolymerization starts. The period necessary for obtaining a perceptible amount of polymerization is a measure of the efficiency of the photopolymerization initiator, and is named the inhibition period.

In some circumstances it may be desirable that the photopolymerizable composition comprises a hydrophilic or hydrophobic colloid as carrier or binding agent for the ethylenically unsaturated organic compound and the photopolymerization-initiating diacylhalomethane. By the presence of this binding agent the properties of the light-sensitive layer are of course highly influenced. The choice of the binding agent is dependent on its solubility in solvents, which can also be used as solvents for the ethylenically unsaturated organic compounds and for the diacylhalomethane of the invention. Such binding agents are, e.g., polystyrene, polymethyl methacrylate, polyvinyl acetate, pdyvinylbutyral, partially saponified cellulose acetate and other polymers that are soluble in solvents for initiators and monomers. In some circumstances water-soluble polymers can be used such as gelatin, casein, starch, carboxymethylcellulose and polyvinylalcohol. The ratio of photopolymerizable composition to binding agent obviously also influences the photopolymerization. The larger this ratio, the higher the photopolymerization rate of one particular ethylenically unsaturated organic compound.

If the photopolymerizable composition is water-soluble, water may be used as a solvent for coating the support. On the contrary, if water-soluble photopolymerizable compositions are used, organic solvents, mixtures of organic solvents, or mixtures of organic solvents and water may be employed.

The process of the invention is applied to the photopolymerization of compositions comprising ethylenically unsaturated organic compounds. These compositions may comprise one or more ethylenically unsaturated polymerizable compounds such as styrene, acrylamide, methacrylamide, methyl methacrylate, diethylaminoethyl methacrylate, and acrylonitrile. When two of these monomers are used in the same photopolymerizable composition or if they are mixed with other polymerizable compounds, copolymers are formed during the photopolymerization. It is further presumed that in the case where the photopolymerizable material is used together with a polymeric binding agent, graft copolymers are formed between the polymeric binder and the photopolymerized material.

The photopolymerizable composition may also comprise or consist of unsaturated compounds having more than one carbon-to-carbon double bond, e.g. two terminal vinyl groups, or of a polymeric compound being ethylenically unsaturated. During polymerization of these compositions cross-linking usually occurs by means of the plurally unsaturated compound. Examples of compounds containing more than one carbon-to-carbon double bond are, e.g. divinylbenzene, diglycol diacrylates, and N,N-alkylene-bis-acrylamides. Examples of polymeric compounds containing ethylenically unsaturation are, e.g., allyl esters of polyacrylic acid, maleic esters of polyvinyl alcohol, polyhydrocarbons yet containing carbon-to-carbon double bonds, unsaturated polyesters, cellulose acetomaleates, and allylcellulose.

In the photopolymerization of ethylenically unsaturated compounds with the diacylhalomethanes of the invention high temperatures are not required. The exposure, however, to intensive light sources at a relatively short distance, brings about a certain heating of the mass to be polymerized, which heating exercises a favorable influence upon the polymerization rate.

The products of the invention are useful as adhesives, coating and impregnating agents, safety glass-interlayers, etc. When photopolymerization of the compositions is carried out within a mold, optical articles such as lenses can be obtained.

The photopolymerizable compositions which contain diacylhalomethanes are also useful in the preparation of photographic images and the present invention comprises spreading the polymerizable composition upon a surface such as a surface of metal and printing a design thereon photographically by exposure to light through a suitable image pattern. Hereby the light induces polymerization in the exposed areas of the photopolymerization composition whereby the polymeric layer is rendered insoluble in the solvent or solvents used for applying the photopolymerizable layer. Thereafter the nonexposed areas are washed away with a solvent for the monomeric material. In this way printing plates and photographic etching resists are manufactured, which can be further used as planographic printing plates, as matrices for printing matter, as screens for silk screen printing, and as photoresists for etching.

The imagewise photopolymerization can also induce differential softening properties to the layer. This makes possible a reproduction process by material transfer when the imagewise photopolymerized layer is heated subsequently and pressed against a receiving sheet, so that the softened areas are transferred to the receiving sheet.

The following examples illustrate the present invention.

EXAMPLE 1

An amount of 10 ml. of methyl methacrylate, which was free from stabilizing agents, was brought in a borosilicate glass test tube together with 10 ml. of benzene and 8.36 mg. of 2,2-dibromo-2-(phenylsulphonyl)-acetophenone. The dissolved oxygen was then removed by bubbling through nitrogen. Subsequently the glass tube was sealed.

The exposure was then carried out with the aid of a high pressure mercury vapor lamp of 300 watt, placed at a distance of 18 cm. The polymer formed thereby was then precipitated in excess methanol, separated, dried in vacuo, and weighed. The following results were obtained.

| Exposure time in minutes | Yield in mg. | % by weight of polymer |
|---|---|---|
| 30 | 762 | 8.1 |
| 60 | 1078 | 11.5 |
| 120 | 1360 | 14.5 |
| 180 | 1528 | 16.3 |
| 240 | 1604 | 17.1 |

EXAMPLE 2

An amount of 10 ml. of acrylonitrile in 10 ml. of benzene was brought in a borosilicate glass test tube together with 6.78 mg. of 2-bromo-2-(phenylsulphonyl)-acetophenone. After removal of the oxygen, as described in example 1, the test tube was sealed. The exposure was carried out as in example 1. The polymer formed was precipitated with methanol. The following results were attained.

| Exposure time in minutes | Yield in mg. | % by weight of polymer |
|---|---|---|
| 30 | 1.180 | 14.8 |
| 60 | 1.800 | 22.6 |
| 120 | 2.510 | 31.5 |
| 180 | 2.700 | 33.9 |
| 240 | 2.830 | 35.5 |

EXAMPLE 3

An amount of 16 ml. of styrene, 4 ml. of benzene, and 38.2 mg. of 2,2-dibromo-1,3-diphenyl-1,3-propanedione was brought in a borosilicate glass test tube. The dissolved oxygen was removed as described in example 1. Subsequently the glass tube was sealed. The exposure and separation of the polymer formed were carried out as described in example 1. The following results were attained.

| Exposure time in minutes | Yield in mg. | % by weight of polymer |
|---|---|---|
| 30 | 173 | 1.2 |
| 60 | 320 | 2.2 |
| 120 | 865 | 3.9 |
| 180 | 880 | 6.06 |

Example 4

$1\times10^{15}$ mole of initiator according to the following table was dissolved each time in 4 ml. of ethylene glycol monomethyl ether. The resulting solution was admixed with solutions of 3 g. of acrylamide in 5 ml. of water. These solutions were brought in a borosilicate glass test tube and exposed therein to a 80-watt high-pressure mercury vapor lamp placed at a distance of 10 cm. The following results were attained.

TABLE

| Test | Initiator | Time (1) | Time (2) |
|---|---|---|---|
| 1 | 2,2-dibromo-1,3-diphenyl-1,3-propanedione | 6 | 10 |
| 2 | 2-bromo-1,3-diphenyl-1,3-propanedione | 12 | 19 |
| 3 | 2-bromo-2-hydroxy-1,3-diphenyl-1,3-propanedione, acetate | 10 | 15 |
| 4 | 2-bromo-2-(phenylsulphonyl)-acetophenone | 7 | 12 |
| 5 | 2,2-dibromo-2-(phenylsulphonyl)-acetophenone | 7 | 10 |
| 6 | 2,2-dibromo-benzo[b]-thiophene-3 (2H)one-1,1-dioxide | 10 | 37 |
| 7 | 2-bromo-2(m-carboxyphenylsulphonyl)-acetophenone | 8 | 14 |
| 8 | 2,2-dibromo-1,3-indanedione | 5 | 10 |
| 9 | 2-bromo-2-(p-tolylsulphonyl)-acetophenone | 9 | 12 |
| 10 | 2-bromo-2-(phenylsulphonyl)-4′-nitroacetophenone | 6 | 14 |
| 11 | 2-bromo-2-(phenylsulphonyl)4′-dimethylamino-acetophenone | 10 | >60 |
| 12 | 2-bromo-2-(phenylsulphonyl)-1′-acetonaphthone | 4 | 13 |
| 13 | 2,2-dichloro-2-(p-tolylsulphonyl)-acetophenone | 8 | 13 |

[1] In minutes needed to obtain a viscous solution.
[2] In minutes required to obtain a solid product (yield 90–95%).

EXAMPLE 5

An amount of 4.18 mg. of 2,2-dibromo-2-(phenylsulphonyl)-acetophenone was dissolved in 4 ml. of ethylene glycol monomethyl ether. A solution of 3 g. of acrylamide in 5 ml. of water was added thereto. The mixture was then poured in a borosilicate glass test tube, which was sealed afterwards. The exposure was performed with the aid of a 300-watt tungsten lamp placed at a distance of 10 cm. The tungsten lamp emitted radiation in the visible range of the spectrum. After an exposure of 28 minutes the solution became viscous and after 45 minutes it was solid. Yield 90–95 percent.

EXAMPLE 6

An amount of $1\times10^{15}$ mole of dibromo-bis(phenylsulphonyl)-methane was dissolved in 4 ml. of ethylene glycol monomethyl ether. A solution of 3 g. of acrylamide in 5 ml. of water was added thereto. The resulting solution was brought in a borosilicate glass test tube and freed from dissolved oxygen by bubbling through nitrogen for 30 minutes. The test tube was then sealed and exposed to an 80-watt mercury vapor lamp placed at a distance of 10 cm. A perceptible polymerization occurred after 30 minutes of exposure and after 70 minutes a yield of 90–95 percent was attained.

EXAMPLE 7

A solution was prepared starting from:

0.1 g. of initiator, 10 g. of copolymer of ethylene and maleic anhydride, which had been dried previously at 110° C., 5 ml. of triethylene glycol diacrylate, 25 mg. of 2,6-di-tert.butyl-p-cresol, and 5 ml. of acetone.

Glass plates were coated with this solution in such a way that layers having a thickness of approximatively 300 μ were formed. The plates were dried in the dark. Subsequently they were exposed through a line negative to a 80-watt high-pressure mercury vapor lamp placed at a distance of 5 cm. The unexposed areas were washed away with acetone.

A fine image of the original was obtained after an exposure of 15 min. when using 2-bromo-2-(phenylsulphonyl)-acetophenone or the acetate of 2-bromo-2-hydroxy-1,3-diphenyl-1,3-propane-dione as initiator.

We claim:

1. Process for the photopolymerization of ethylenically unsaturated organic compounds, which comprises irradiating with light of wavelengths ranging from 2,500 to 500 Angstrom a composition comprising a photopolymerizable ethylenically unsaturated organic compound and as a photopolymerization initiator a diacylhalomethane corresponding to one of the following structural formulas:

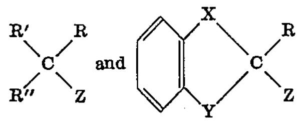

wherein:

Z represents chlorine or bromine,

R represents hydrogen, chlorine, bromine or acetyloxy,

R' and R'' represent benzoyl, nitrobenzoyl, dimethylaminobenzoyl, phenylsulfonyl, carboxyphenylsulfonyl, methylphenylsulfonyl, or naphthoyl, X and Y represent carbonyl or sulfonyl.

2. Process according to claim 1, wherein the photopolymerization initiator is 2,2-dibromo-2-(phenylsulfonyl)-acetophenone.

3. Process according in claim 1, wherein the photopolymerization initiator is 2-bromo-2-(phenylsulfonyl)-acetophenone.

4. Process according to claim 1, wherein the photopolymerization initiator is 2,2-dibromo-1,3-indanedione.

5. Process according to claim 1, wherein the photopolymerization initiator is 2,2-dibromo-1,3-diphenyl-1,3-propanedione.

6. Process according to claim 1, wherein the photopolymerization initiator is the acetate of 2-bromo-2-hydroxy-1,3-diphenyl-1,3-propanedione.

7. A process for the production of a polymeric photographic relief image, which comprises irradiating to light of wavelengths ranging from 2,500 to 5,000 Angstrom through a master pattern a photographic element comprising a support having thereon a light-sensitive layer comprising at least one photopolymerizable ethylenically unsaturated organic compound and as a photopolymerization initiator a diacylhalomethane corresponding to one of the following structural formulas:

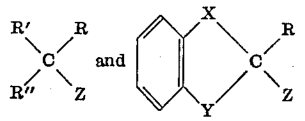

wherein:

Z represents chlorine or bromine,

R represents hydrogen, chlorine, bromine, or acetyloxy,

R' and R'' represent benzoyl, nitrobenzoyl, dimethylaminobenzoyl, phenylsulfonyl, carboxyphenysulfonyl, methylphenylsulfonyl, or naphthoyl, X and Y represent carbonyl or sulfonyl, whereby in the exposed areas said ethylenically unsaturated organic compound is polymerized, and removing the layer in the nonexposed areas by washing with a solvent for said ethylenically unsaturated organic compound.

8. A photopolymerizable element comprising a support and superposed thereon a light-sensitive layer comprising at least one photopolymerizable organic compound and as photopolymerization initiator a compound containing a diacylhalomethane corresponding to one of the following structural formulas:

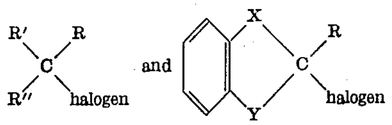

wherein:

Z represents chlorine or bromine,

R represents hydrogen, chlorine, bromine or acetyloxy,

R' and R'' represent benzoyl, nitrobenzoyl, dimethylaminobenzoyl, phenylsulfonyl, carboxyphenylsulfonyl, methylphenylsulfonyl, or naphthoyl, X and Y represent carbonyl or sulfonyl.

* * * * *